(12) United States Patent
Iizuka

(10) Patent No.: US 7,210,589 B2
(45) Date of Patent: May 1, 2007

(54) TRANSPORT APPARATUS

(75) Inventor: Yukio Iizuka, Shiga-ken (JP)

(73) Assignee: Daifuku Co., Ltd., Osaka (JP)

( * ) Notice: Subject to any disclaimer, the term of this patent is extended or adjusted under 35 U.S.C. 154(b) by 78 days.

(21) Appl. No.: 10/840,141

(22) Filed: May 6, 2004

(65) Prior Publication Data

US 2004/0253087 A1    Dec. 16, 2004

(30) Foreign Application Priority Data

May 20, 2003    (JP)    ............................. 2003-141858

(51) Int. Cl.
    *B66C 13/06*    (2006.01)
(52) U.S. Cl. ..................... 212/273; 212/270; 212/331
(58) Field of Classification Search ................ 212/326, 212/327, 331–333, 270, 272, 273
    See application file for complete search history.

(56) References Cited

U.S. PATENT DOCUMENTS

| 617,051 | A | * | 1/1899 | Sawyer ........................ 414/756 |
| 1,694,084 | A | * | 12/1928 | Straight ....................... 212/285 |
| 2,375,747 | A | * | 5/1945 | Brown ........................ 294/67.31 |
| 4,168,857 | A | * | 9/1979 | Kloos ........................... 294/81.4 |
| 4,350,254 | A | * | 9/1982 | Noly ............................. 212/279 |
| 5,102,291 | A | * | 4/1992 | Hine ............................. 414/816 |
| 5,165,556 | A | | 11/1992 | Karhunen |
| 6,068,438 | A | * | 5/2000 | Barry ........................... 414/392 |
| 6,129,396 | A | * | 10/2000 | Asada et al. .............. 294/86.41 |
| 6,682,113 | B2 | * | 1/2004 | Cox et al. ..................... 294/104 |
| 6,692,219 | B2 | * | 2/2004 | Coomer et al. ............. 414/754 |
| 6,752,585 | B2 | * | 6/2004 | Reimer et al. .............. 414/783 |
| 6,986,636 | B2 | * | 1/2006 | Konig et al. ................. 414/763 |

FOREIGN PATENT DOCUMENTS

JP          H9-77455          3/1997

* cited by examiner

*Primary Examiner*—Thomas J. Brahan
(74) *Attorney, Agent, or Firm*—The Webb Law Firm

(57) ABSTRACT

The present invention provides an apparatus for suspending and transporting articles, and is provided with a wobble prevention member that is capable of moving between a support position where it abuts against a lateral surface of an article and a release position, and in the support position keeps the article from wobbling in at least one direction. The wobble prevention member has a roller capable of rotation about a vertical shaft, and by the roller abutting against the article when the wobble prevention member is in the support position, wobbling of the article is reduced.

23 Claims, 11 Drawing Sheets

TRANSPORT APPARATUS

BACKGROUND OF THE INVENTION

Conventional transport apparatuses were provided with a fall prevention member that allowed them to prevent an article from falling by changing the position of the fall prevention member to a receiving position while the vehicle is moving with the article being suspended by a holding member. However, the vehicle wobbles particularly when it is stopped or when it starts moving, and when it moves over curved portions of a path, and it was not possible to keep the suspended article from wobbling, leading to the risk that the article may be damaged.

SUMMARY OF THE INVENTION

The present invention was made in light of the foregoing problem, and it is an object thereof to provide a transport apparatus capable of reducing wobbling of an article suspended by a holding member.

The transport apparatus according to the present invention is provided with a wobble prevention means that is capable of moving between a support position where it abuts a lateral surface of an article and a release position, and that at the support position, prevents wobbles in at least one direction of the article. The wobble prevention means has a roller, capable of rotation about a vertical shaft, that abuts against the article when the wobble prevention means is in the support position.

As a result of the roller abutting against the article, wobbling of the article is at least reduced, and this lowers the risk of damaging the article.

DETAILED DESCRIPTION OF THE INVENTION

The transport apparatus according to the present invention is described below with reference to the drawings. In this embodiment, semiconductor substrates are used as an example of a transported product being manufactured, but the object to be transported is not limited to this example.

Figure 1:
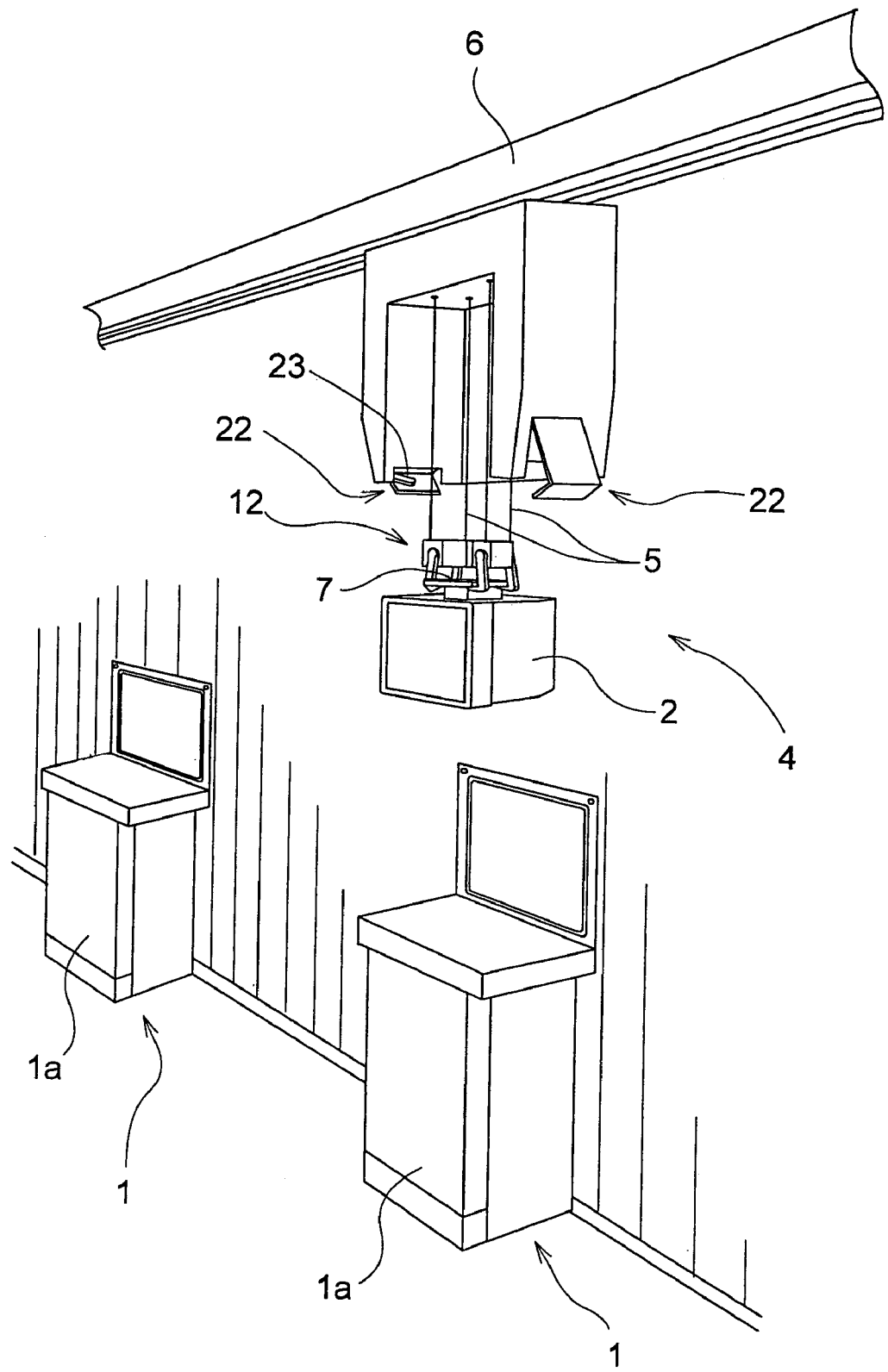
FIG. 1 is a perspective view showing the overall transport apparatus.
Figure 3:
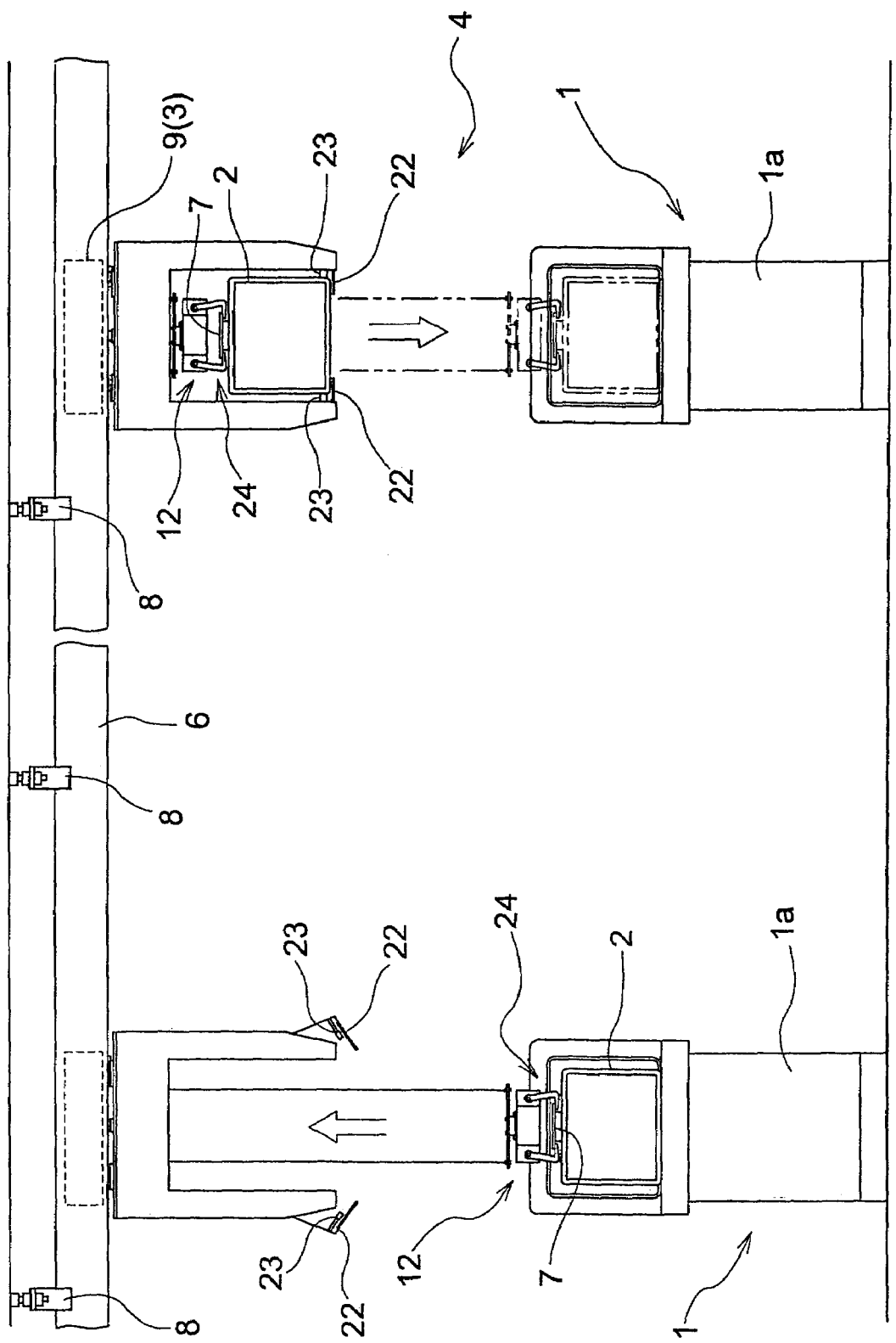
FIG. 3 is a lateral view schematically showing the operation of the transport apparatus.

As shown in FIGS. 1 and 3, the transport apparatus carries a receptacle 2 (article) accommodating semiconductor substrates in the process of being manufactured to a plurality of article processing locations 1 where the semiconductor substrates are subjected to predetermined processing. The transport apparatus has a transporter 3 having an ascending/descending unit 12 provided to a holding member 4 of the transporter 3 to hold the receptacle 2 in a suspended state and to move it vertically.

The transporter 3, in a stopped state, raises and lowers the ascending/descending unit 12 of the holding member 4 by winding or unwinding wires 5 and grasps the receptacle 2 to remove it from a setting stand 1a of an article processing location 1 or to set the receptacle 2 on the setting stand 1a of an article processing location 1.

The transporter 3 then is moved along a guide rail 6 with the receptacle 2 being suspended by the holding member 4 to transport the receptacle 2 from a receptacle introduction location to a setting stand 1a of the plurality of article processing locations 1, or from the setting stand 1a of an article processing location 1 to the setting stand 1a of another article processing location 1, or from a setting stand 1a of the plurality of article processing locations 1 to a receptacle discharge location.

Figure 2:
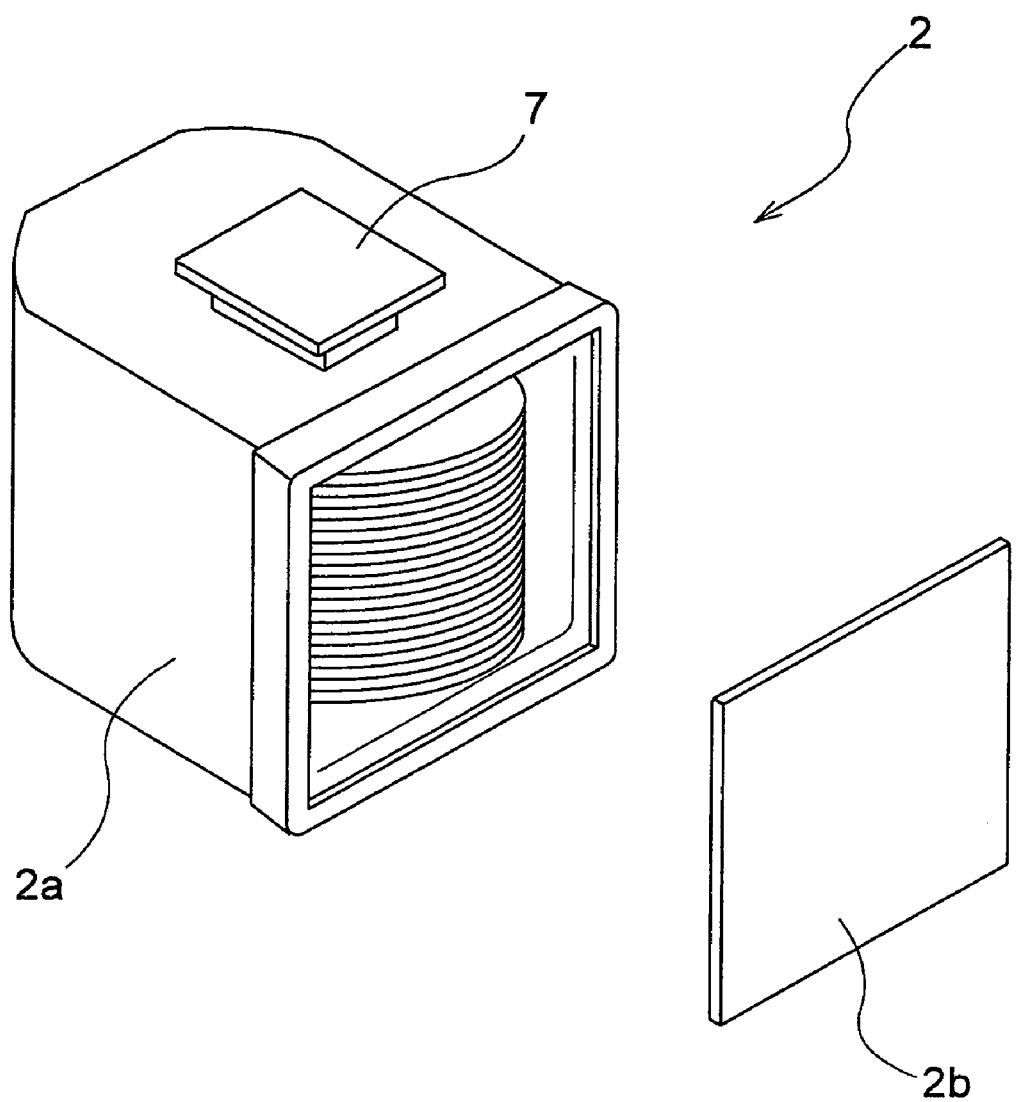
FIG. 2 is a perspective view showing the receptacle as an article.

As shown in FIG. 2, the receptacle 2 has a main receptacle unit 2a whose lateral portion is open so that semiconductor substrates can be accommodated therein, and a lid member 2b that closes the opening of the main receptacle unit 2a in a substantially airtight manner.

Further, a flange 7 that allows the receptacle 2 to be supported in a suspended manner by the holding member 4 is formed on an upper portion of the main receptacle unit 2a.

Figure 4:
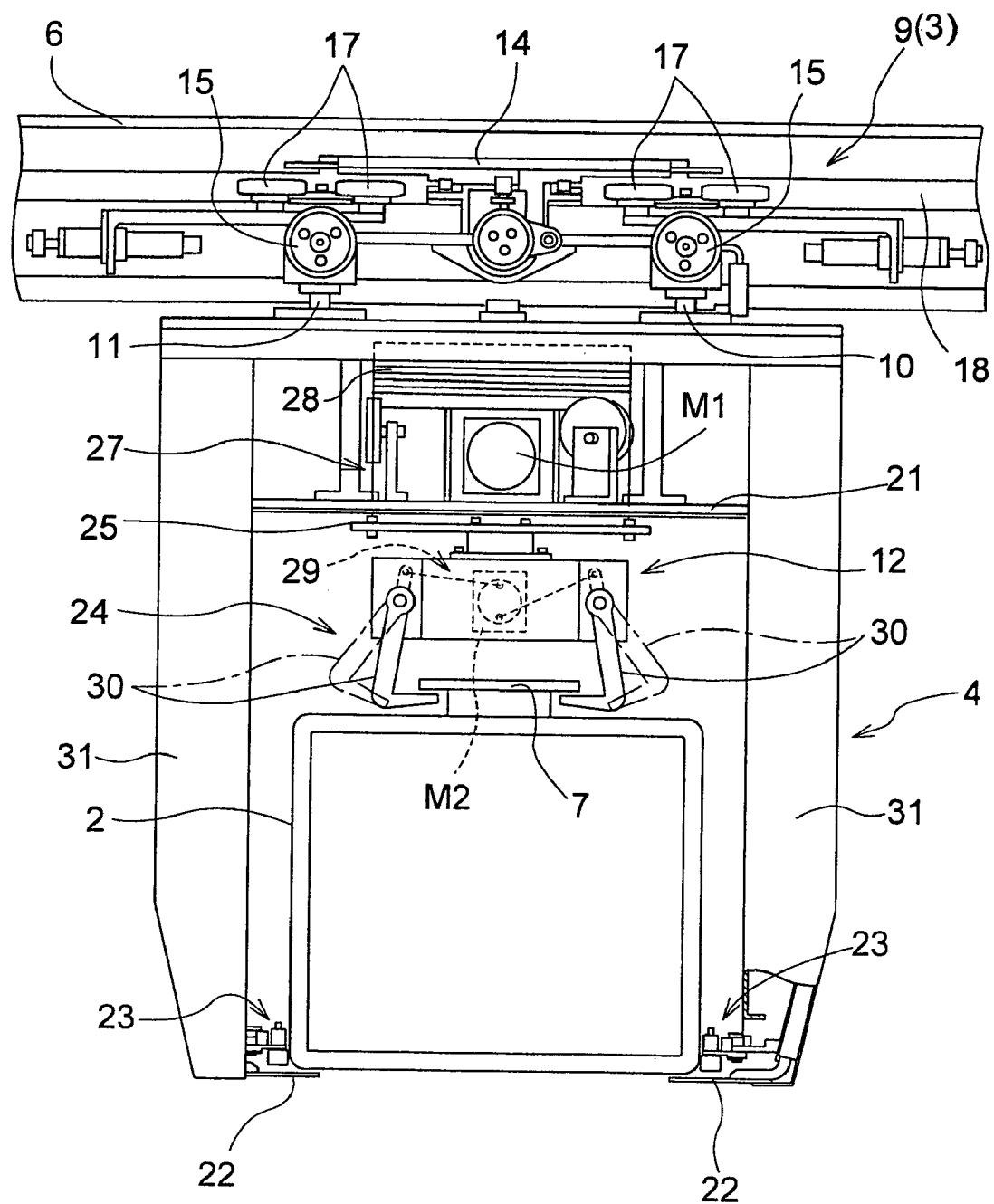
FIG. 4 is a lateral view of the vehicle.

As shown in FIG. 3 and FIG. 4, the transporter 3 travels along the guide rail 6, which is fastened to the ceiling by brackets 8.

The guide rail 6 has a generally horizontal upper surface and a generally vertical pair of lateral surfaces. A space is formed between this pair of lateral surfaces.

Figure 5:
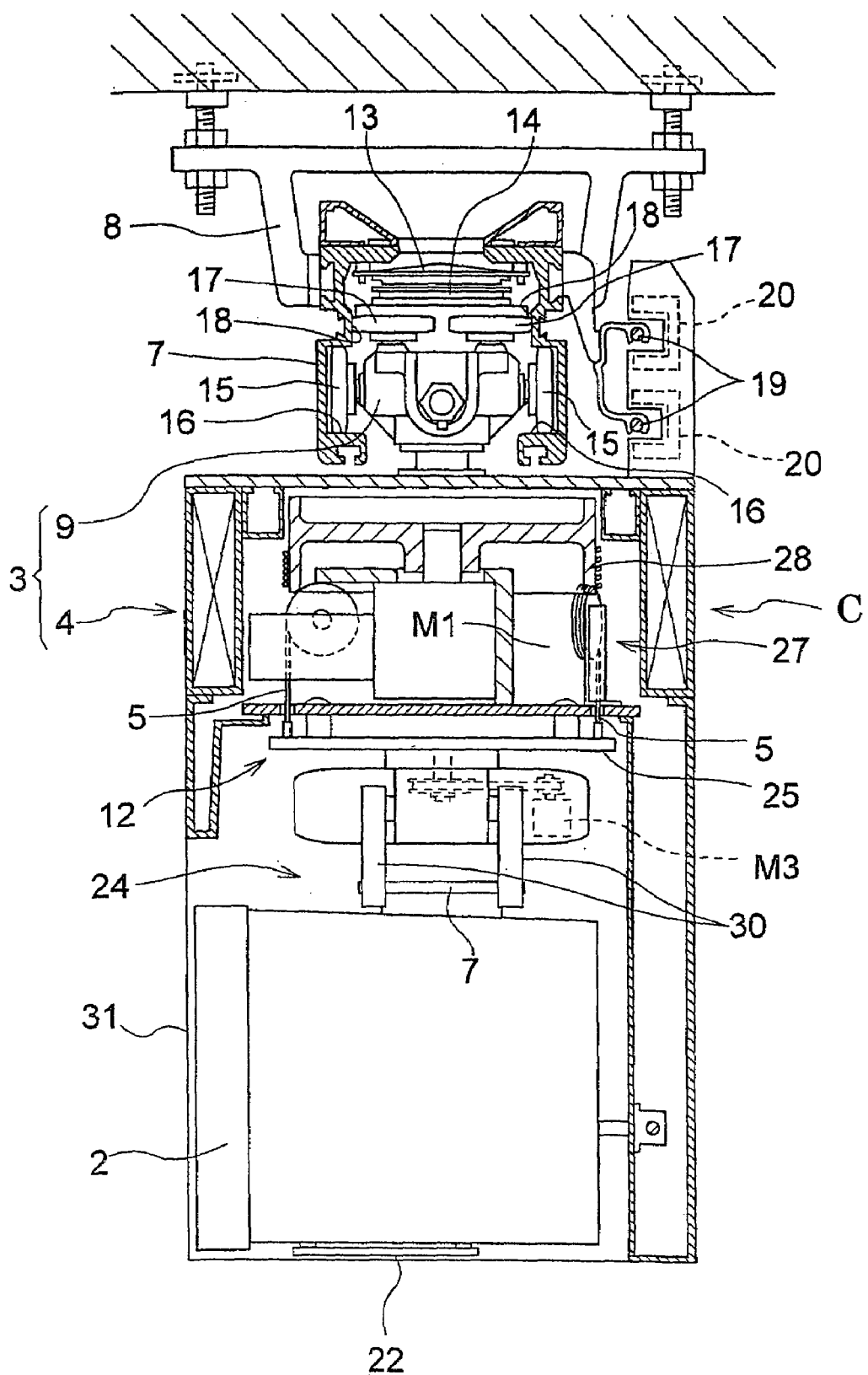
FIG. 5 is a vertical section plan view of the vehicle.

As shown in FIG. 5, the transporter 3 has a linear motor-type vehicle 9 disposed within the space formed inside the guide rail 6, and the holding member 4, which is connected to the vehicle 9 by front and rear connecting rods 10 and 11 and which is positioned below the guide rail 6.

The vehicle 9, as shown in FIG. 5, is provided with a linear motor with a magnet 13 fastened to the lower side of the upper wall of the guide rail 6 and with a primary coil 14 furnished in the transporter 3 in proximal opposition to the magnet 13. This linear motor provides the transporter 3 with the drive force. Both the magnet 13 and the primary coil 14 are positioned within the space inside the guide rail 6.

A travel guide surface 16 in contact with travel wheels 15 provided to the vehicle 9 and an anti-vibration guide surface 18 in contact with anti-vibration wheels 17 provided to the vehicle 9 are formed within the space inside the guide rail 6.

A feeder line 19 supported on one lateral face of the guide rail 6 and a receiver coil 20 supported by the transporter 3 are provided. A magnetic field is generated by allowing AC current to flow through feeder line 19, and due to this magnetic field, the power required on the transporter 3 side is generated in the receiver coil 20. Thus power is transmitted without contact.

As shown in FIG. 4, the holding member 4 is provided with the ascending/descending unit 12 supported on a frame member 21 which in turn is connected to the vehicle 9 by the front and rear connecting rods 10 and 11. The ascending/ descending unit 12 holds the flange 7 and raises and lowers the receptacle 2 in a suspended state.

The ascending/descending unit 12 has an ascending/descending member 25 capable of moving up and down with respect to the vehicle 9, and a holding unit 24 attached to the ascending/descending member 25 in such a manner that it can hold the flange 7 of the receptacle 2 and release it. The ascending/descending member 25 is supported by an ascending/descending actuator mechanism 27 provided in the frame member 21 so that it can be moved vertically.

Figure 6:
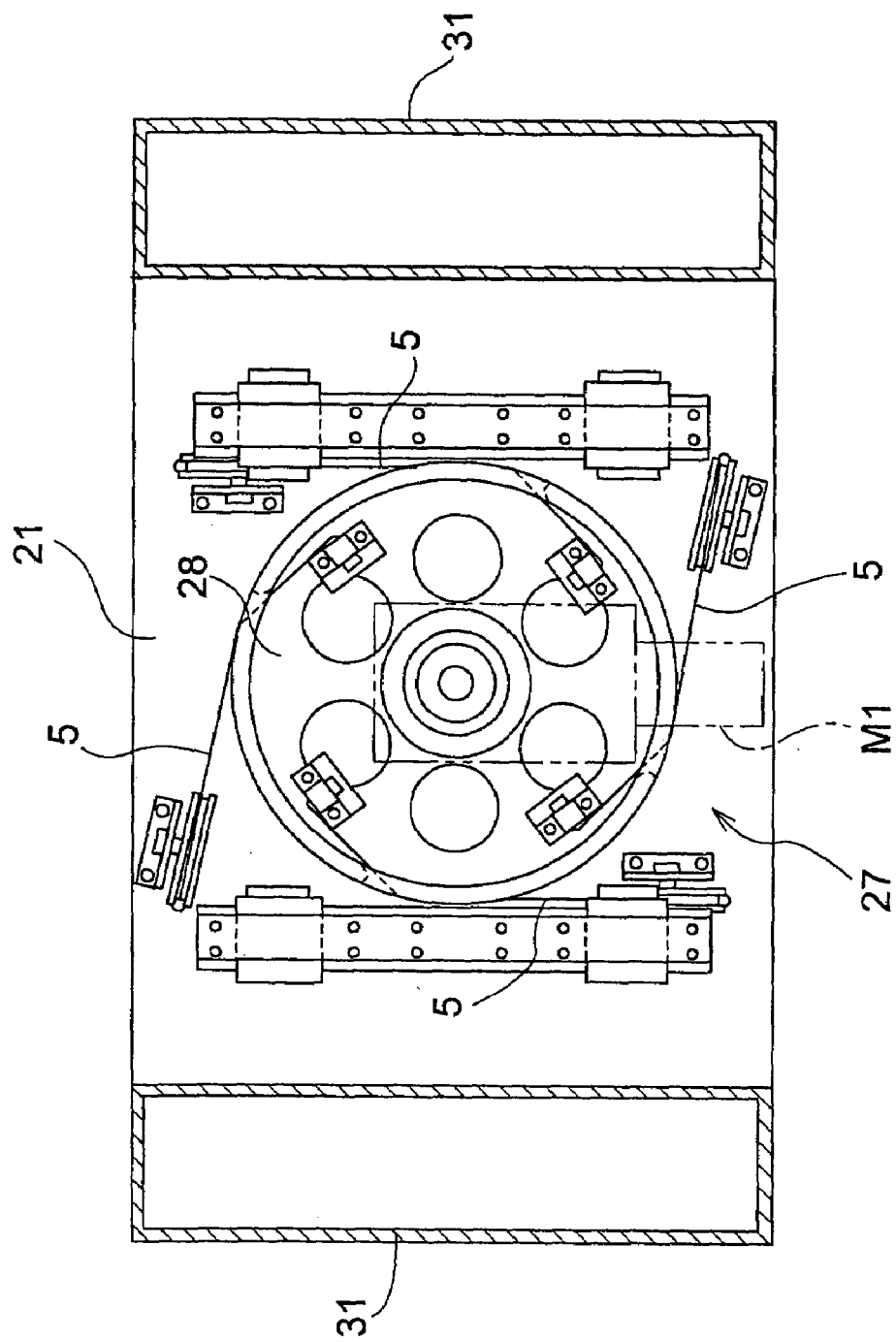
FIG. 6 is a plan view showing the primary components of the vehicle.

Further, the ascending/descending actuator mechanism 27, as shown in FIGS. 4 to 6, is capable of winding and unwinding four wires 5 simultaneously due to a rotating drum 28 rotated about a shaft in the vertical direction by a drum drive motor M1, and by rotating the drum 28 forward and in reverse, the ascending/descending member 25 supported in a suspended manner by the four wires 5 is lifted and lowered while maintaining a substantially horizontal posture.

The holding unit 24 is provided with a pair of clamps 30 for holding the flange 7 of the receptacle 2. The clamps 30 are capable of pivoting about horizontal pivot shafts, and are configured such that they can switch between a holding posture for holding the flange 7 by pivoting the pair of clamps 30 toward one another via a link mechanism 29 with a hold operation motor M2, and a release posture for releasing hold of the flange 7 by pivoting the pair of clamps 30 away from one another; Each clamp 30 is an L-shaped arm.

Further, the holding unit 24 is attached to the ascending/descending member 25 in such a manner that it can rotate about a vertical shaft by a pivot motor M3. In addition, it is preferable to have a mechanism to move the holding unit 24 with respect to the vehicle 9 in a direction perpendicular to the traveling direction of the vehicle 9. This mechanism can be placed, for example, between the pair of the connecting rods 10, 11 and the holding member 4. A mechanism to move one object with respect to the other while suspending the first object from the second object is known and is not described here in detail as it is considered to be within the knowledge of a person skilled in the art. For example, the mechanism has a plate secured to the bottom portions of the connecting rods 10, 11, a pair of guide rails formed in the plate, projections fixed to the holding member 4 and that move within the rails, a pair of threaded shafts in threaded engagement with one shaft fixed to the plate and the other to the holding member 4, and with one of the shafts driven by an electric motor.

In addition to the ascending/descending unit 12, the holding member 4 is also provided with fall prevention members 22 that can switch between a receiving position that is capable of receiving the bottom surface portion 2c of the receptacle 2 and a retreated position that is retreated from below the suspended receptacle 2. As shown in FIG. 9, each fall prevention member 22 is made of a moving member 22a with an L-shaped cross section, a pair of frames 22b fastened to the moving member 22a, and a plate-shaped member 22c fastened to the frames 22b.

Figure 7:
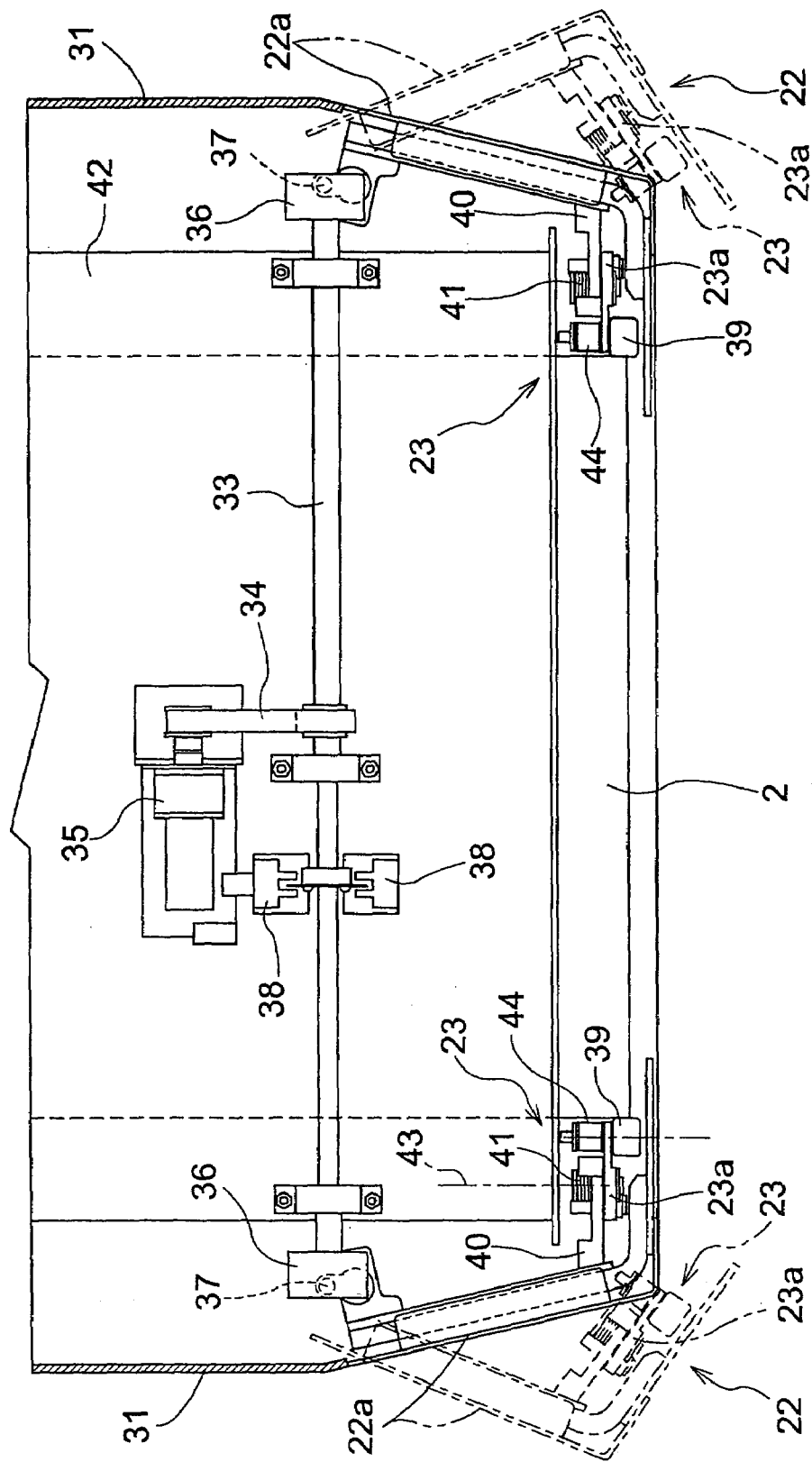
FIG. 7 is a lateral view showing the fall prevention member and the wobble prevention member in the holding member.
Figure 8:
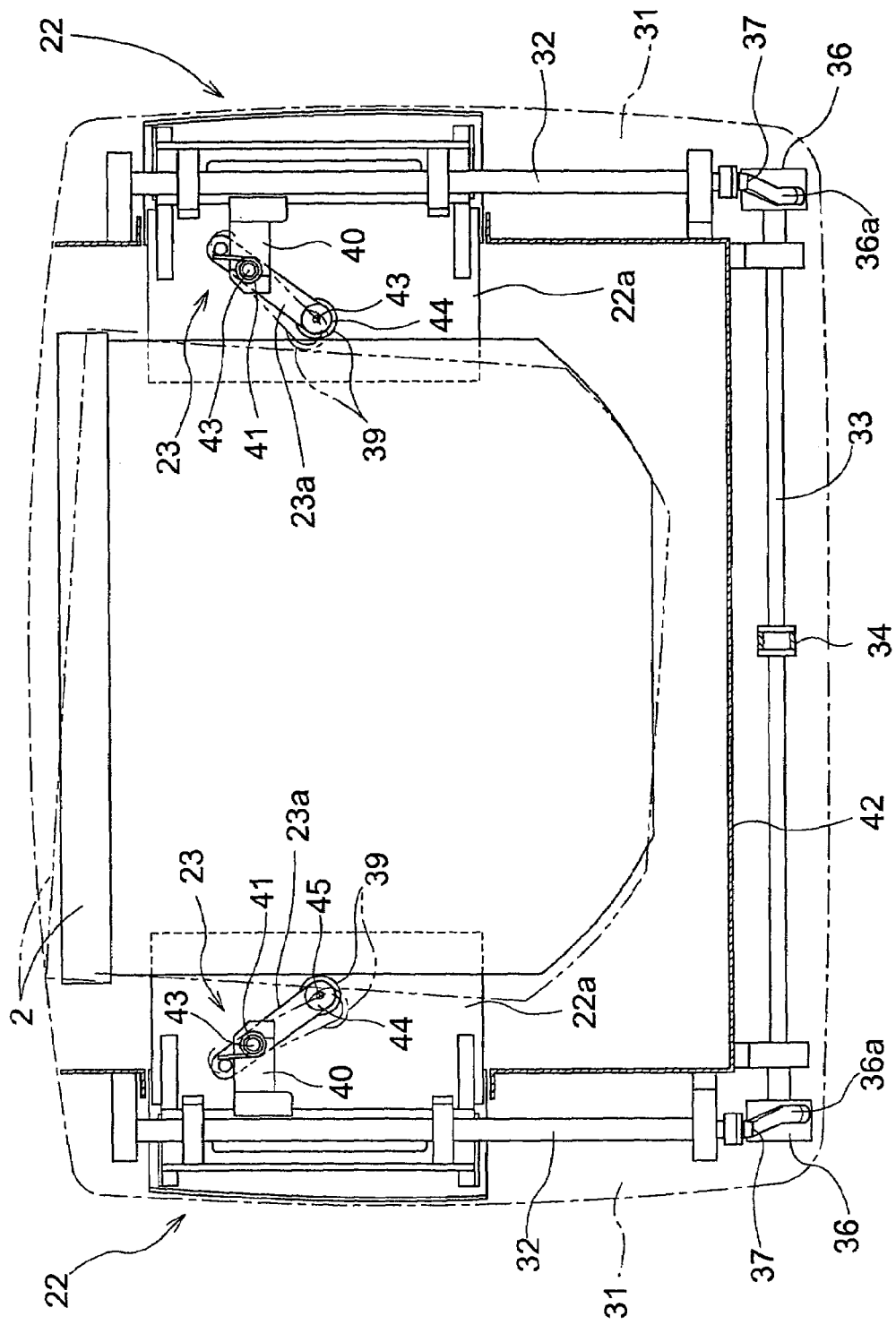
FIG. 8 is a plan view showing the fall prevention member and the wobble prevention member in the holding member.

As shown in FIG. 7 and FIG. 8, the moving members 22a of the fall prevention members 22 are attached to a pair of vertical frame portions 31 provided extending downward from front and rear locations, respectively, with respect to the transporter 3 in such a manner that the each of the moving members 22a rotates together with the horizontal shaft 32.

Moreover, the pair of moving members 22a are moved between the receiving position shown by the solid line in FIG. 7 and the retreated position shown by the dotted line in FIG. 7 due to pivoting about the horizontal shafts 32.

FIG. 7 shows the fall prevention members 22 and wobble prevention members 23, for example, and is a vertical section of the transporter 3 in which other members have been omitted, and FIG. 8 shows the fall prevention members 22 and the wobble prevention members 23, for example, and is a horizontal plan view of the transporter 3 in which other members have been omitted.

A drive motor 35, that is capable of forward and reverse rotation, is provided as a drive means for driving the fall prevention members. Further, a shaft 33 that extends in the front to back direction of the transporter 3, and cylindrical cams 26 and cam followers 37 for rotating the horizontal shafts 32 in conjunction with rotation of the shaft 33, are provided in order to change the position of the pair of moving members 22a between the receiving position and the retreated position.

To describe this in greater detail, the cylindrical cams 36 are provided at the front end portion and the rear end portion, respectively, of the shaft 33 as shown in FIG. 8, and the cam followers 37, which are guided in cam grooves 36a of the cylindrical cams 36, are provided at one end portion of the horizontal shafts 32. As shown in FIG. 9, the horizontal shafts 32 are offset from the axis of the shaft 33.

Figure 9A:
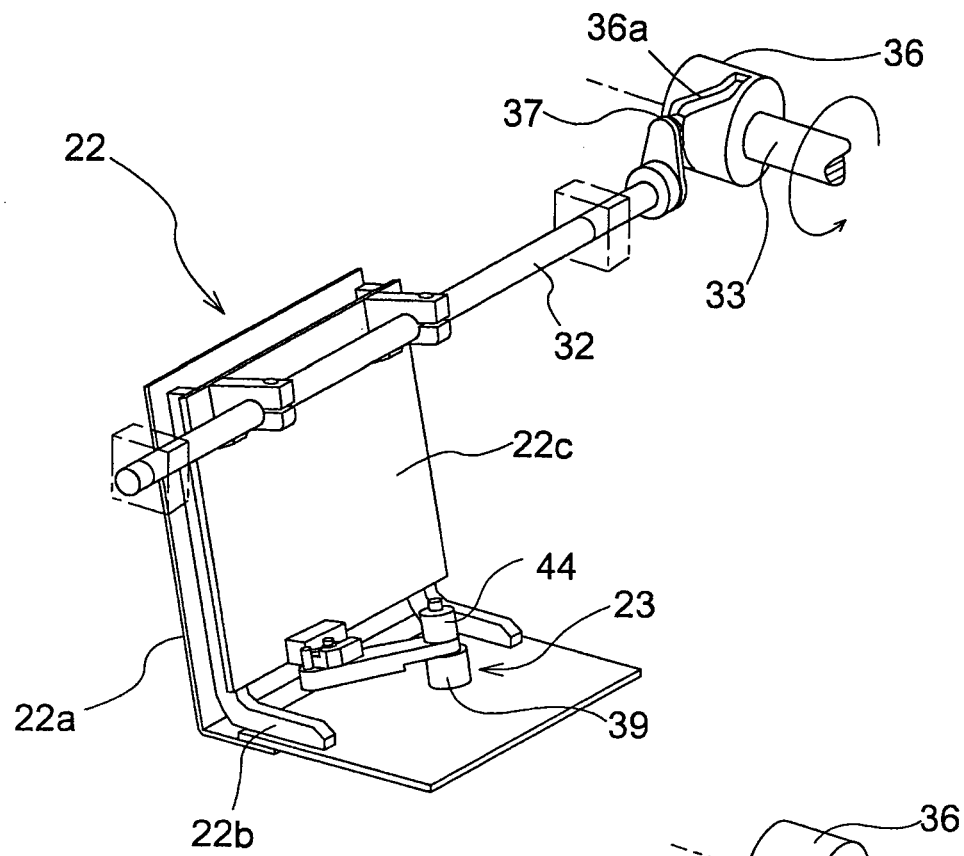
FIG. 9 is a diagram showing the primary components of the fall prevention member and the wobble prevention member.
Figure 9B:
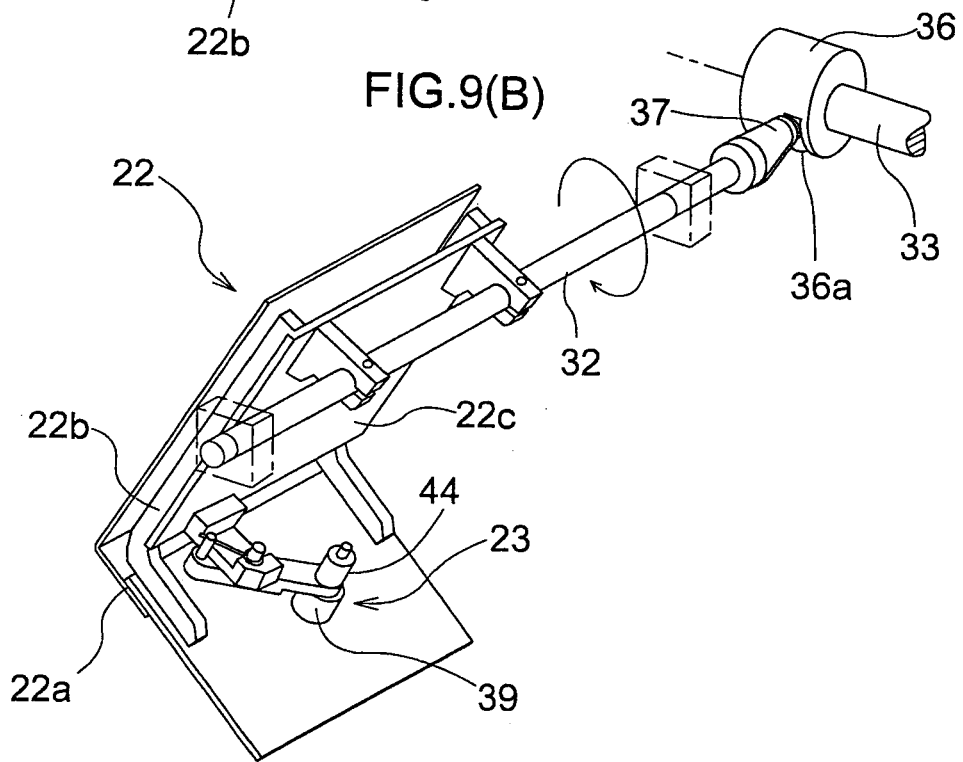

Further, the fall prevention member drive motor 35 that is shown in FIG. 7 is rotated forward or in reverse to rotate the shaft 33 via a timing belt 34, thereby guiding the cam followers 37 within the cam grooves 36a of the cylindrical cams 36. As shown in FIG. 9, the horizontal shafts 32 are rotated and the moving members 22a are pivoted about the horizontal shafts 32. FIG. 9(A) shows the positions of the various parts when the position of the moving members 22a has been changed to the receiving position, and FIG. 9(B) shows the positions of the various parts when the position of the moving members 22a has been changed to the retreated position.

A position change detection sensor 38 is provided near the shaft 33, and by detecting the amount of rotation of the shaft 33, detects when the position of the fall prevention member 22 has been changed to the receiving position and when the position of the fall prevention member 22 has been changed to the retreated position.

The moving members 22a are attached to a portion in which a portion of the vertical frame portions 31 has been cut out in the vehicle width direction. The horizontal shafts 32 span substantially the entire length in the vehicle width direction.

Further, members such as the shaft 33 and the fall prevention member drive motor 35 are supported by the vertical frame portions 31 and a cover 42 extending downward from the frame 21 and provided at one end side in the vehicle width direction.

As shown in FIGS. 7 to 9, the fall prevention members 22 have wobble prevention members 23 for pressing against and supporting lateral surface portions of the suspended receptacle 2 on both the front and rear sides of the transporter 3. The wobble prevention members 23 are switched to a support position (where they press against and support a lateral surface portion of the receptacle 2) by moving the fall prevention members 22 to the receiving position, and are switched to a release position (where holding by pressing against the lateral surface portions of the receptacle 2 is released) by moving the fall prevention members 22 to the retreated position.

As illustrated in FIG. 7 and FIG. 8, each wobble prevention member 23 is provided with a bracket 40 that is fastened to the plate-shaped member 22c of the fall prevention member 22, a pivoting member 23a capable of pivoting about a vertical shaft 43 provided in the bracket 40, and a roller 39 which is attached in such as manner that it can rotate about a vertical shaft 45 at the front end portion of the pivoting member 23a and which abuts against a lateral surface portion of the receptacle 2. The pivoting member 23a is capable of pivoting such that the roller 39 is moved toward and away from a lateral surface portion of the receptacle 2, and is elastically urged toward a lateral surface portion of the receptacle 2 by an elastic means, which is a torsion spring 41.

The elastic urging means is not limited to a torsion coil spring, and it is also possible to adopt various other types of elastic members, such as a resin molded member, plate springs or coil springs, as the elastic urging means.

The wobble prevention members 23, as shown in FIG. 8, press against and support a central portion, in the vehicle width direction, of the lateral surface portion of the receptacle 2 with the rollers 39, and by allowing the rollers 39 to rotate, movement of the receptacle 2 about the vertical shaft or movement of the receptacle 2 in the vehicle width direction is permitted while wobbling of the receptacle 2 in the front to back direction of the transporter 3 is prevented or reduced. The rollers 39 are made of urethane, but they can also be made of elastic materials other than urethane.

In FIG. 8 the receptacle 2 that has moved about the vertical shaft is shown by the dotted line.

Figure 10:
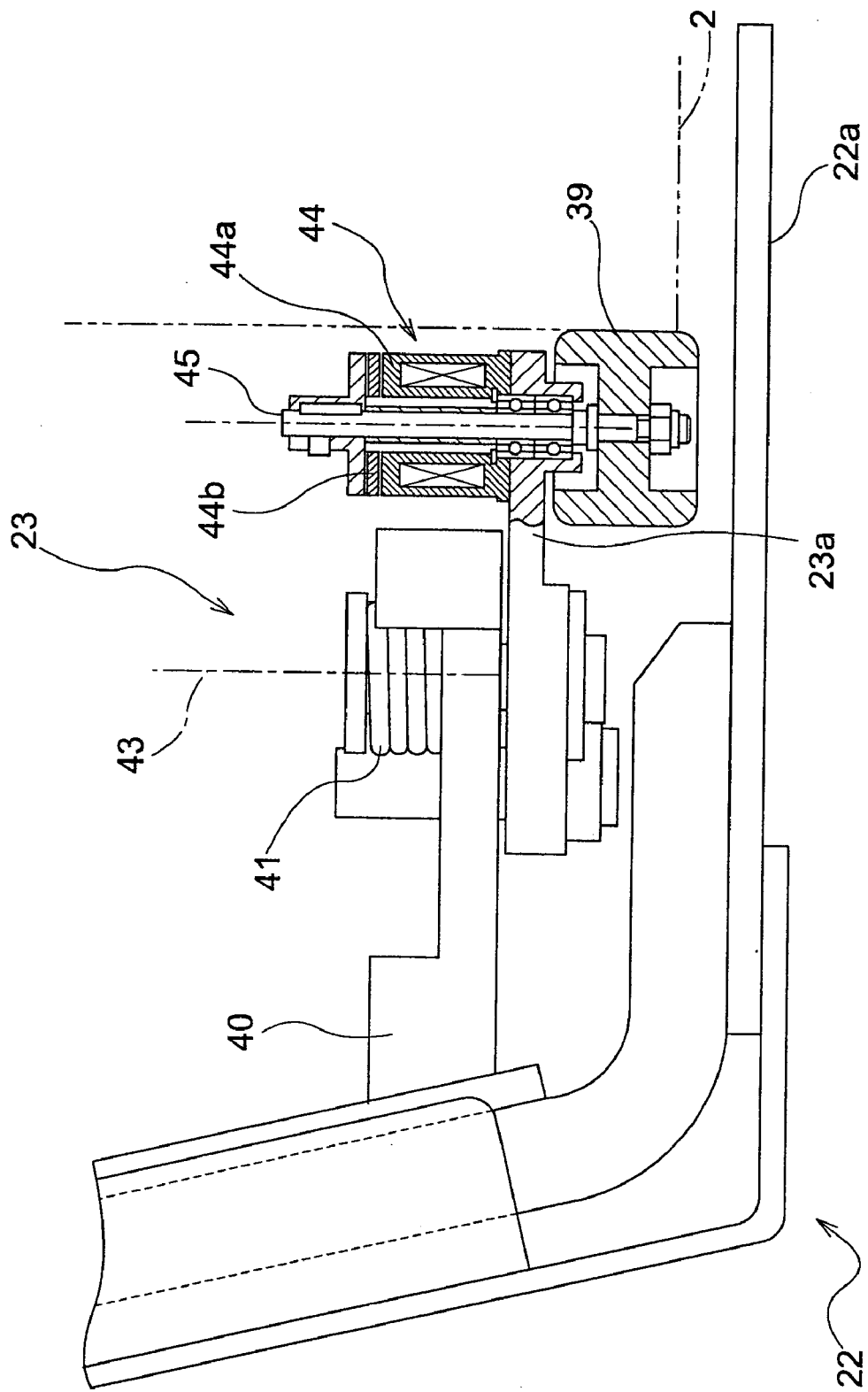
FIG. 10 is a sectional view showing the primary components of the wobble prevention member.

As shown in FIG. 10, an electromagnetic brake 44 is provided as a roller fastening means (or as an electromagnetic actuation means) which, with the wobble prevention members 23 switched to the support position, is capable of switching between a fastened state where it prevents rotative operation of the roller 39 and a non-fastened state where it allows rotative operation of the roller 39. The electromagnetic brake 44 has an electromagnetic coil 44a fastened to the tip of the pivoting members 23a, and a magnetic member 44b such as a permanent magnet or iron that is fastened to the upper end of a vertical shaft 45 that is capable of rotating as a single unit with the roller 39. Consequently, the electromagnetic brake 44, in the conductive state, is switched to the fastened state where it prevents rotation of the vertical shaft 45, thus, the rollers 39, and in the non-conductive state, is switched to the non-fastened state where it allows rotation of the rollers 39.

A control portion C for controlling movement of the transporter 3 and controlling the raising and lowering of the ascending/descending unit 12 is provided, and this control portion controls movement of the transporter 3 and controls the raising and lowering of the holding unit 34 based on commands from the facility side in which the transport apparatus is located and based on the detection information from the various sensors provided in the transporter 3.

The operation of the transporter 3 is described in greater detail below.

When transporting the receptacle 2 from one article processing location 1 to another, for example, then first the transporter 3 is stopped at a desired position with respect to the initial article processing location 1.

Then, the fall prevention member drive motor 35 is activated to change the position of the fall prevention members 22 to the retreated position as shown in FIG. 9(B), thereby switching the wobble prevention members 23 to the release position, and then, as shown in FIG. 3, the ascending/descending unit 12 is lowered to grasp the receptacle 2 placed on a set placing position (for example, a central position) of the setting stand 1a of the article processing location 1.

When grasping of the receptacle 2 by the holding unit 24 is complete, then the ascending/descending unit 12 is lifted up slightly to a set height and the fall prevention member drive motor 35 is activated to move the fall prevention members 22 to the receiving position as shown in FIG. 9(A), thereby switching the wobble prevention members 23 to the support position. The pair of rollers 39 abut against the receptacle 2 at this time. Next, the holding unit 24 is lifted up toward the vehicle 9 so as to raise the receptacle 2 up to the transporting position.

Then, with the receptacle 2 being held by the holding unit 24, and with the electromagnetic brake 44 in the non-fastened state, the transporter 3 is moved along the guide rail 6.

While the transporter 3 is moving, the position of the receptacle 2 is adjusted as necessary and then the electromagnetic brake 44 is switched to the fastened state and the transporter 3 is moved along the guide rail 6 and stopped at the desired position with respect to the target article processing location 1.

Then, the fall prevention member drive motor 35 is activated to change the position of the fall prevention members 22 to the retreated position as shown in FIG. 9(B), and as shown in FIG. 3, the holding unit 24 is lowered to place the receptacle 2 on a set placing position (for example, the central position) of the setting stand 1a of the article processing location 1.

To provide an explanation of how the position of the receptacle 2 is adjusted, if the set placing position of the setting stand 1a of the target article processing location 1 is offset in the vehicle width direction with respect to the center of the guide rail 6, or if the orientation of the set placing position of the setting stand 1a of the target article processing location 1 is different than the orientation of the article being held by the holding member 4, then, as the transporter 3 is moving, the holding unit 24 is moved in the vehicle width direction or the holding unit 24 is pivoted about the vertical shaft with respect to the transporter 3, thereby adjusting the position of the receptacle 2.

Then, after the position of the receptacle 2 has been adjusted, the electromagnetic brake 44 is switched to the fastened state and the transporter 3 is moved along the guide rail 6, with the receptacle 2 being held by the holding member 4, up to the desired position with respect to the article processing location 1 to which it is to be lowered.

OTHER EMBODIMENTS

Without exceeding the scope of the present invention, alterations to the preferable embodiment described above are possible. Several possible examples thereof are illustrated below.

Figure 11:
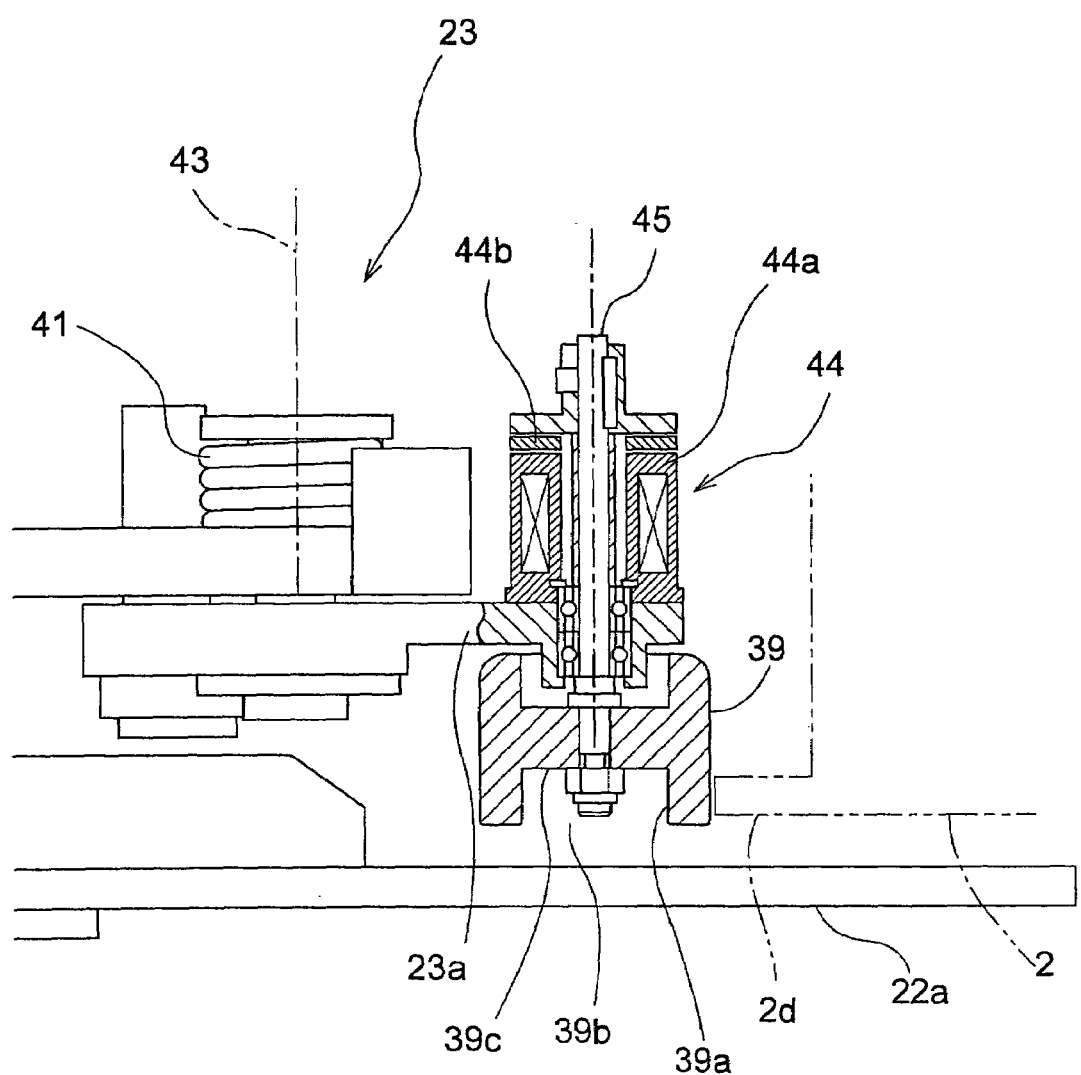
FIG. 11 is a primary component sectional view showing how the wobble prevention members of the present invention are adopted for a receptacle having a different shape.

(1) As shown in FIG. 11, receptacle 2 may have a flange 2d near a bottom portion thereof. In this case, it is preferable that the height of the rollers 39 or the receptacle 2 is adjusted so that the rollers abut against a lateral surface of the flange 2d. The flange 2d has a lateral surface that extends vertically and horizontal upper and lower surfaces. A space 39b having an upper limit 39c is formed inside the rollers 39. There are several conceivable possibilities for the relative position between the upper surface or the lower surface of the flange 2d and the upper limit 39c of the space 39b. The height of the rollers 39 or the receptacle 2 can be adjusted so that the lower surface of the flange 2d is positioned at a level that is above or below the upper limit 39c of the space 39b of the rollers 39. It is also possible to adjust the height of the rollers 39 or the receptacle 2 so that the upper surface of the flange 2d is positioned at a level that is lower than the upper limit 39c of the space 39b of the rollers 39.

(2) In the above embodiment, both the fall prevention members 22 and the wobble prevention members 23 are respectively provided at a front side position and a rear side position of the transporter 3 with respect to the receptacle 2, but for example it is also possible to provide them on the left and right sides in the vehicle width direction with respect to the receptacle 2, and the positions where the wobble prevention members 23 are furnished can be suitably altered.

(3) In the above embodiment, the wobble prevention members 23 for preventing shake are provided to the front and rear of the receptacle 2, but the number of the wobble prevention members 23 can be suitably altered, and for example, it is possible to have one or three or more wobble prevention members 23.

When only a single wobble prevention member 23 is used, then, for example, the number of fall prevention members 22 is set to one and a wobble prevention member 23 that is capable of switching between a support position and a release position is provided to the rear of the receptacle 2 and a fixed wall portion against which a lateral surface portion of the receptacle 2 can be pressed is provided in front of the receptacle 2, and by the single wobble prevention member 23 pressing the lateral surface portion of the receptacle 2 against the fixed wall portion, the lateral surface portions of the receptacle 2 can be pressed and supported.

(4) In the above embodiment, the fall prevention members 22 are provided at position to the front and rear of the transporter 3 with respect to the receptacle 2, but the number of the fall prevention members 22 can be suitably altered, and for example, it is possible to have one or three or more fall prevention members 22.

When only a single fall prevention member 22 is used, then, for example, a fall prevention member that spans the entire length of the vehicle front-to-back width of the receptacle 2 when its position has been changed to the receiving position is provided at a position to the rear of the transporter 3 with respect to the receptacle 2, and a fixed wall portion that follows a lateral surface portion of the receptacle 2 is provided at a position in front of the transporter 3 with respect to the receptacle 2, and allowing the receptacle 2 to be caught due to the combined action of the single fall prevention member and the fixed wall portion.

(5) In the above embodiment, the wobble prevention members 23 are provided with a pivoting member 23a, but for example, in place of the pivoting member 23a it is possible to provide a horizontally traveling body that is movably supported such that its front end portion is moved toward and away from the lateral surface portion of the receptacle 2 and is elastically urged toward the lateral surface portion of the receptacle 2 by an elastic urging means, and the rollers 39 can be attached to the front end portion of the horizontally traveling bodies in such a manner that the rollers 39 are capable of rotating about a vertical shaft.

(6) In the above embodiment, an electromagnetic brake 44 serving as an electromagnetic actuation means is used as the roller fastening means, but the roller fastening means is not limited to an electromagnetic actuation means, and it is also possible to achieve the roller fastening means using a mechanical brake having a pair of mating portions, such as a dog clutch.

(7) In the above embodiment, the fall prevention members 22 are provided in such a manner that by pivoting about the horizontal shafts 32 they are switched between a receiving position and a retreated position, but is it also possible to provide the fall prevention members 22 in such a manner that by moving them toward and away from a lateral surface portion of the receptacle 2 they are shifted between the receiving position and the retreated position.

(8) In the above embodiment, the positions of the pair of moving members 22a were changed between the receiving position and the retreated position by a single fall prevention member drive motor 35, but it is also possible to achieve this function by providing each of the moving members 22a with a drive motor for changing their position between the receiving position and the retreated position.

(9) The above embodiment illustratively describes a transport apparatus that carries a receptacle 2 for accommodating semiconductor substrates as the article, but the article that is carried can be suitably altered.

What is claimed is:

1. A transport apparatus having a guide rail for transporting an article, comprising:
    a vehicle that moves along the guide rail;
    a holding means supported by the vehicle, for holding the article;
    a winding member supported by the vehicle and operatively connected with the holding means;
    a motor supported by the vehicle and operatively connected with the winding member to rotate the winding member to move the holding means vertically;
    a wobble prevention means supported on the vehicle, and movable between a support position where it abuts against a side of the article and a release position where abutting against the side of the article is released, for, in the support position, keeping the article from wobbling in at least one direction;
    a roller provided in the wobble prevention means and capable of rotation about a vertical shaft, and movable toward and away from the side of the article, and urged toward the side of the article;
    wherein the roller abuts against the article when the wobble prevention means is in the support position; and
    means for fastening the roller, said fastening means being capable of switching between a fastened state where it inhibits rotation of the roller and a non-fastened state where it permits rotation of the roller.

2. The transport apparatus according to claim 1, further comprising:
    a fall prevention member supported on the vehicle, which is capable of moving between a receiving position where at least a part of the member is located below a bottom surface portion of the article and can receive the bottom surface portion of the article and a retreated position where it is retreated from below the article;
    wherein the wobble prevention means is provided in the fall prevention member in such a manner that it is switched to the support position by changing the position of the fall prevention member to the receiving position and is switched to the release position by changing the position of the fall prevention member to the retreated position.

3. The transport apparatus according to claim 2,
    wherein the fall prevention member is provided at one of a front side position and at a rear side position and a further fall prevention member is provided at the other of the front side position and the rear side position in the front to back direction of the vehicle with respect to the article; and wherein the roller abuts on a central portion, in the vehicle width direction, of a side surface of the article.

4. The transport apparatus according to claim 2, wherein the fall prevention member is moved between the receiving position and the retreated position by pivoting about a horizontal shaft.

5. The transport apparatus according to claim 4, wherein the holding means is capable of lowering the article to a level substantially below a lowest portion of the fall prevention member.

6. The transport apparatus according to claim 2, wherein the part of the fall prevention member located below a bottom surface portion of the article is adapted to be spaced apart downwardly from the article when the fall prevention member is in the receiving position, so that the fall prevention member does not contact the article.

7. The transport apparatus according to claim 2, wherein the fall prevention member pivots about a generally horizontal shaft to move between the receiving position and the retracted position.

8. The transport apparatus according to claim 2, wherein the fall prevention member is supported by the vehicle without the holding means interposed between the fall prevention member and the vehicle.

9. The transport apparatus according to claim 1,
wherein the wobble prevention member has a pivoting member, which is pivotably supported in a rockable manner such that its front end portion is moved toward and away from a side of the article and which is urged toward a portion of the article by an elastic urging means;
wherein the roller is attached to the free end portion of the pivoting member such that the roller can rotate about a vertical shaft.

10. The transport apparatus according to claim 1, wherein the fastening means is an electromagnetic brake.

11. The transport apparatus according to claim 1,
wherein the holding means is adapted to hold an upper portion of the article.

12. The transport apparatus according to claim 1, wherein the wobble prevention means is supported by the vehicle without the holding means interposed between the wobble prevention means and the vehicle.

13. A transport apparatus having a guide rail for transporting an article, comprising:
a vehicle that moves along the guide rail;
an ascending/descending actuator mechanism supported on the vehicle and having a plurality of wires and a motor operatively connected to the plurality of wires;
a holding unit supported by the ascending/descending actuator mechanism via the wires, and capable of moving the article up to a transporting position due to driving of the motor, and having a plurality of arms for holding the article;
a fall prevention member supported on the vehicle and capable of moving between a position extending below a bottom of the article and a position retreated from below the bottom of article, when the article is in the transporting position;
a pivoting member capable of pivoting about a first shaft supported by the fall prevention member;
a roller rotatable about a second shaft provided on a free end of the pivoting member; and a brake capable of switching between a non-fastened state where it permits rotation of the roller about the second shaft and a fastened state where it does not permit rotation of the roller;
wherein the roller abuts on a side of the article when the fall prevention member is in the position extending below the bottom of the article.

14. The transport apparatus according to claim 13, wherein the brake is an electromagnetic brake comprising an electromagnetic coil fastened to the pivoting member and a magnetic member fastened to the second shaft and in opposition to the electromagnetic coil.

15. The transport apparatus according to claim 14, wherein the pivoting member is urged in the direction of a side of the article by an urging spring.

16. The transport apparatus according to claim 14, wherein the fall prevention member can pivot about a horizontal shaft.

17. The transport apparatus according to claim 13, further comprising:
an ascending/descending member to which the wires are attached;
wherein the holding unit is supported by the ascending/descending actuator mechanism via the ascending/descending member; and
wherein a vertical shaft is provided between the holding unit and the ascending/descending member and a motor for altering the posture of the article with respect the vehicle about the vertical shaft is provided to one of the holding unit and the ascending/descending member.

18. The transport apparatus according to claim 13, wherein the ascending/descending actuator mechanism is capable of lowering the article to a level substantially below a lowest portion of the fall prevention member.

19. The transport apparatus according to claim 13, wherein a part of the fall prevention member located below a bottom surface portion of the article is adapted to be spaced apart downwardly from the article when the fall prevention member is in the position extending below a bottom of the article, so that the fall prevention member does not contact the article.

20. A method for transporting an article with a transport apparatus that comprises a vehicle that moves along a guide rail in order to transport the article, an ascending/descending actuator mechanism supported on the vehicle and having a plurality of wires and a first motor that is operatively connected to the plurality of wires, a holding unit which is supported by the ascending/descending actuator mechanism via the wires, which is capable of moving the article up to a transporting position due to driving of the first motor and which has a plurality of arms for holding the article, a vertical shaft and a second motor provided in the holding unit for altering the posture of the article with respect to the vehicle, a fall prevention member supported on the vehicle and capable of moving between a position extending below a bottom of the article and a position retreated from below the bottom of article when the article is in the transporting position, a pivoting member capable of pivoting about a first shaft fastened to the fall prevention member, and a roller capable of rotation about a second shaft provided on a free end of the pivoting member, the method comprising:
holding an article with the holding unit;
raising the article to a set height with the ascending/descending actuator mechanism;
abutting the roller against the article by moving the fall prevention member to a position extending below a bottom of the article;

raising the article up to the transporting position with the ascending/descending actuator mechanism;

altering the posture of the article about the vertical shaft by driving the second motor; and moving the vehicle along the guide rail.

21. A method for transporting an article with a transport apparatus that comprises a vehicle that moves along a guide rail in order to carry an article, an ascending/descending actuator mechanism supported on the vehicle and having a plurality of wires and a first motor that is operatively connected to the plurality of wires, a holding unit which is supported by the ascending/descending actuator mechanism via the wires, which is capable of moving the article up to a transporting position due to driving of the motor and which has a plurality of arms for holding the article, a vertical shaft and a second motor provided in the holding unit for altering the posture of the article with respect to the vehicle, a fall prevention member supported on the vehicle and capable of moving between a position extending below a bottom of the article and a position retreated from below the bottom of article when the article is in the transporting position, a pivoting member capable of pivoting about a first shaft fastened to the fall prevention member, a roller capable of rotation about a second shaft provided on a free end of the pivoting member, and a brake capable of switching between a non-fastened state where it permits rotation of the roller about the second shaft and a fastened state where it does not permit rotation of the roller, the method comprising:

holding an article with the holding unit;

raising the article to a set height with the ascending/descending actuator mechanism;

abutting the roller against the article by moving the fall prevention member to a position extending below a bottom of the article;

raising the article up to the transporting position with the ascending/descending actuator mechanism;

moving the vehicle along the guide rail; and switching the brake to the fastened state once movement of the vehicle has begun.

22. The method for transporting an article according to claim 21, further comprising: altering the posture of the article about the vertical shaft by driving the second motor while the vehicle is moved along the guide rail.

23. A transport apparatus having a guide rail for transporting an article, comprising:

a vehicle that moves along the guide rail;

an ascending/descending actuator mechanism supported on the vehicle and having a plurality of wires and a motor operatively connected to the plurality of wires;

a holding unit supported by the ascending/descending actuator mechanism via the wires, and capable of moving the article up to a transporting position due to driving of the motor, and having a plurality of arms for holding the article;

a fall prevention member supported on the vehicle and capable of moving between a position extending below a bottom of the article and a position retreated from below the bottom of article, when the article is in the transporting position;

a pivoting member capable of pivoting about a first shaft supported by the fall prevention member; and a roller rotatable about a second shaft provided on a free end of the pivoting member;

wherein the roller abuts on a side of the article when the fall prevention member is in the position extending below the bottom of the article; and wherein the fall prevention member is supported by the vehicle without the holding unit interposed between the fall prevention member and the vehicle.

\* \* \* \* \*